United States Patent [19]
Watanabe

[11] Patent Number: 5,148,024
[45] Date of Patent: Sep. 15, 1992

[54] ION BEAM PROCESSING APPARATUS AND GAS GUN THEREFOR

[75] Inventor: Chugo Watanabe, Tokyo, Japan

[73] Assignee: Seiko Instruments, Inc., Tokyo, Japan

[21] Appl. No.: 676,447

[22] Filed: Mar. 28, 1991

[30] Foreign Application Priority Data

Mar. 28, 1990 [JP] Japan ................................. 2-32522

[51] Int. Cl.⁵ ........................ C23C 16/04; G21G 5/00
[52] U.S. Cl. ................................ 250/492.2; 250/492.3; 250/492.1; 239/584; 118/723
[58] Field of Search ............. 250/492.21, 492.2 R, 250/492.3, 492.1, 398; 239/584; 118/722, 723

[56] References Cited

U.S. PATENT DOCUMENTS

| | | | |
|---|---|---|---|
| 4,930,439 | 6/1990 | Sano et al. | 118/723 |
| 4,958,074 | 9/1990 | Wolf et al. | 250/309 |
| 4,983,830 | 1/1991 | Iwasaki et al. | 250/309 |

Primary Examiner—Jack I. Berman
Assistant Examiner—James Beyer
Attorney, Agent, or Firm—Spensley Horn Jubas & Lubitz

[57] ABSTRACT

A gun of an ion beam processing apparatus has two coaxial cylinders each of which is combined with a piston so as to drive a nozzle back and forth and drive a valve for controlling valve open and closed states to apply a gas. Drift of an image and damage to a sample caused by moving the nozzle are prevented, and miniaturization of the driving system is realized.

7 Claims, 4 Drawing Sheets

ION BEAM PROCESSING APPARATUS AND GAS GUN THEREFOR

BACKGROUND OF THE INVENTION

Recently, ion beam processing apparatus for repairing a pattern film, a mask and a semiconductor circuit formed on a substrate were disclosed in U.S. Pat. Nos. 4,930,439 and 4,876,112. When this apparatus is used for removing an undesired portion of a film, irradiation is repeatedly carried out while scanning with a focussed ion beam and thereafter the undesired portion is removed by sputtering. When a new film is formed at a portion which lacks a pattern with this apparatus, organic compound gas is applied selectively to the portion while scanning the portion repeatedly with an ion beam so as to condense the organic compound.

Conventionally, a gas gun such as disclosed in U.S. Pat. No. 4,930,439 is used for such ion beam processing apparatus. This gun includes a nozzle body which is inserted in a cylinder and can move back and forth. When the nozzle is moved forward, a gas exhaust passage in the cylinder which is connected to a compound supply source communicates with a gas exhaust passage in the nozzle. On the other hand, when the nozzle is moved backward, communication between the passage of the cylinder and the passage of the nozzle is broken. Accordingly, when the nozzle is moved forward, gas comes out of the head of the nozzle, and when the nozzle is moved backward, gas flow stops.

A valve provided between the passage from the gas supply source and the passage in the nozzle is driven separately to turn on and off the gas without moving the nozzle.

The above noted conventional gas gun has drawbacks as follows:

(1) The valve is opened and closed by the movement of the nozzle. Therefore, the nozzle is moved backward to carry out the steps of removing a film and scanning a certain area of a sample with a focussed ion beam to detect second charged particle and thereby observe the surface of the sample. On the other hand, the nozzle is moved forward for the step of forming a film. According to the change of the position of the nozzle, the electric field in the vicinity of the nozzle changes slightly, which causes a drift of the location of focussed ion beam irradiation at the sample surface.

(2) Conventionally, the distance between the nozzle head and the sample is around 0.5 mm. Therefore, it can often happen that the nozzle head hits the sample when moving or replacing the sample, and the sample and/or the nozzle head are damaged.

OBJECT OF THE INVENTION

An object of the present invention is to provide a gas gun for an ion beam processing apparatus wherein the operation for opening and closing a valve and the operation for moving a nozzle back and forth are separated. A further object of the invention is to reduce the dimensions of such a gun.

Another object of the invention is to provide a precision ion beam processing apparatus.

The above and other objects are achieved, according to the present invention by a gas gun for an ion beam processing apparatus, which gun comprises means defining a first cylinder; a first piston disposed in the first cylinder for movement along a longitudinal axis; means defining a second cylinder; a second piston disposed in the second cylinder for movement parallel to the longitudinal axis; a nozzle; means including an intermediate rod carrying the nozzle and providing a flow path to the nozzle, the intermediate rod having a valve bore and being coupled to the first piston for movement therewith; and a valve rod seated in the valve bore and movable parallel to the longitudinal axis between a closing position in which the flow path is blocked and an opening position in which the flow path is open.

Other and further objects, features and advantages of the invention will appear more fully from the following description.

DESCRIPTION OF THE PREFERRED EMBODIMENTS

Hereinafter, the present invention will be described in detail with reference to the drawings.

Figure 1:
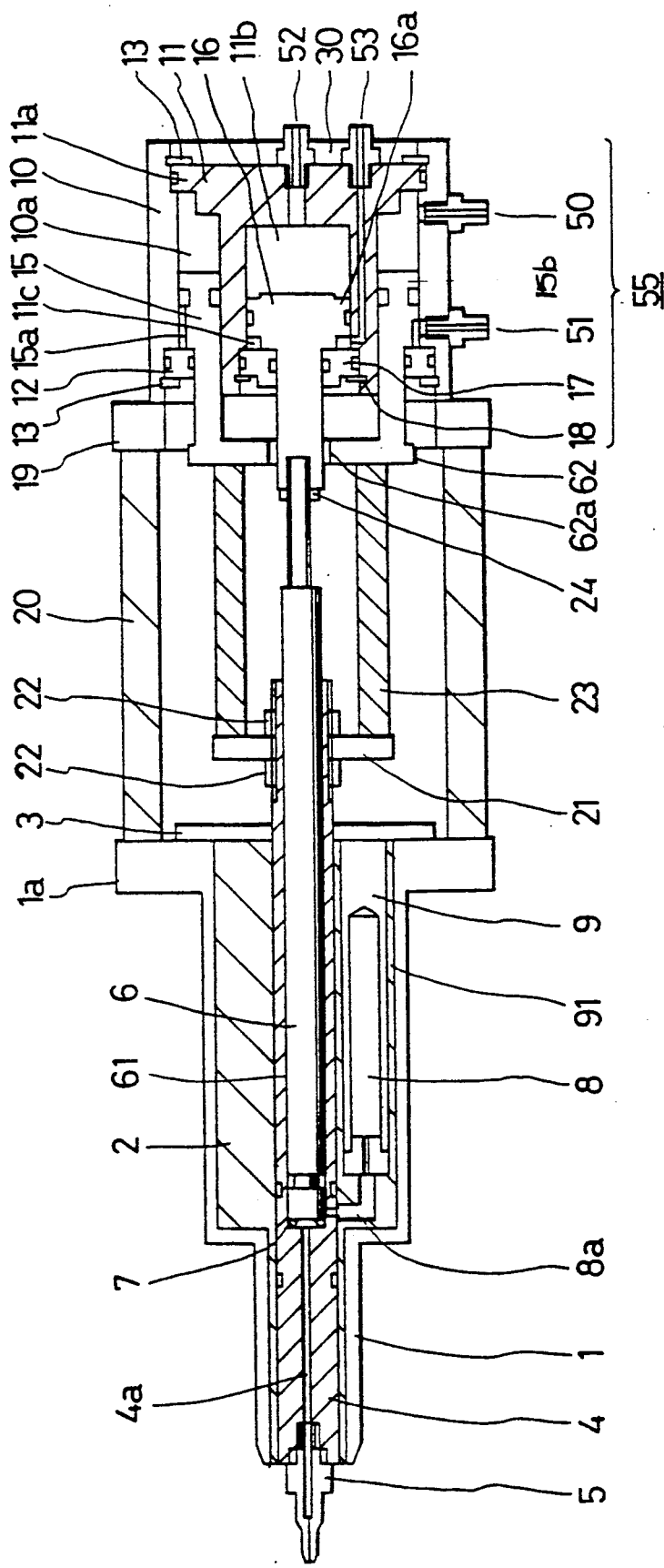
FIG. 1 is a cross-sectional view of a gas gun according to the present invention.

The gas gun of FIG. 1 includes a central case 2 supported inside a main case 1 by an end plate 3 fixed to the main case 1 with a screw (not shown in the drawing). A flange 1a is provided at an edge of the main case 1 to support a casing, or a plurality of rods, 20. An intermediate rod 4 having a longitudinal bore 4a is inserted in the central case 2 in such a manner as to be slidable back and forth, and a nozzle 5 is fixed at one end of intermediate rod 4 by a threaded connection. Bore 4a constitutes a gas passage leading to nozzle 5 at the head of rod 4. The rear end of intermediate rod 4 is provided with a larger bore 61 so that valve rod 6 can be inserted and can slide back and forth inside intermediate rod 4. An O-ring is fixed at the head of the valve rod 6. The central case 2 has a shape such that the end where the nozzle 5 is fixed is narrow and the end where the valve rod 6 is inserted is wider.

The wide part of the central case 2 contains a reservoir insertion hole 91 where a reservoir 9 storing powder 8 of an organic compound and another material is inserted. A gas passage 8a is provided between an end portion of the reservoir insertion hole 91 and an edge portion of the valve rod insertion bore 61. A heater to heat powder 8 and a thermistor to control the heating temperature are also contained in the central case 2 or in the reservoir 9 though they are not shown in the drawing.

A base plate 19 is provided at the other side of casing 20, remote from flange 1a, to support a driving section 55 for driving the intermediate rod 4 and the valve rod 6. The structure of driving section 55 will now be described.

A housing 10 having a cylindrical shape is fixed to the base plate 9. A head cover 11 having the form of a cup is inserted in housing 10 and an edge of the inside of housing 10 engages with the outside of a flange 11a of head cover 11. Head cover 11 is fixed to the housing 10 via a head cover supporting plate 30 and snap ring 13.

There exists a cylindrical gap 10a between the inner surface of housing 10 and the outer surface of head cover 11. A piston 15 for driving intermediate rod 4 is inserted in the gap 10a in such a manner that it can slide back and forth along the axis of the gun. A flange 15b is provided at one end of piston 15 and exactly fits in the gap 10a. There exists a cylindrical gap 15a between the inner surface of housing 10 and the outer surface of piston 15 except at flange 15b. A cover 12 is inserted between housing 10 and piston 15 to fill gap 15a. Cover 12 is fixed in place on housing 10 with a snap ring 13. Housing 10 has air inlets 50 and 51 which are located to correspond to the positions of the opposite ends of gap 10a.

A first cylinder is formed between the outside of head cover 11 and the inside of housing 10, and the piston 15 functions as a first piston for the first cylinder. Piston 15 moves nozzle 5 back and forth via rod 4. A disc shaped plate 62 is provided at the other end of piston 15, and there exists a hole 62a in the center of the plate 62. A rod of a valve piston 16 passes through hole 62a without touching its surface.

Intermediate rod 4 is joined to the plate 62 through a mounting plate 21 and casing or rods 23, and piston 15 and intermediate rod 4 slide together axially back and forth. Plate 21 is fixed to rod 4 by two nuts 22.

The interior of head cover 11 has a cylindrical shape. Valve piston 16 is inserted in head cover 11. A flange 16a of valve piston 16 exactly fits the interior of head cover 11 so that valve piston 16 can slide axially back and forth. There exists a gap 11b between the free end of valve piston 16 and the interior of head cover 11. A rod cover 17 is provided so as to fit between the open end of head cover 11 and valve piston 16. Thus, the inside of head cover 11 is separated into two spaces, the gap 11b and a gap 11c. Head cover 11 has air inlets 52 and 53 which communicate with gap 11b and gap 11c respectively.

A second cylinder is enclosed by head cover 11 and valve piston 16 functions as a second piston. This piston 16 controls on and off states for applying a compound gas.

Valve piston 16 is joined to valve rod 6 through a screw and fixed with a nut 24.

Figure 2:
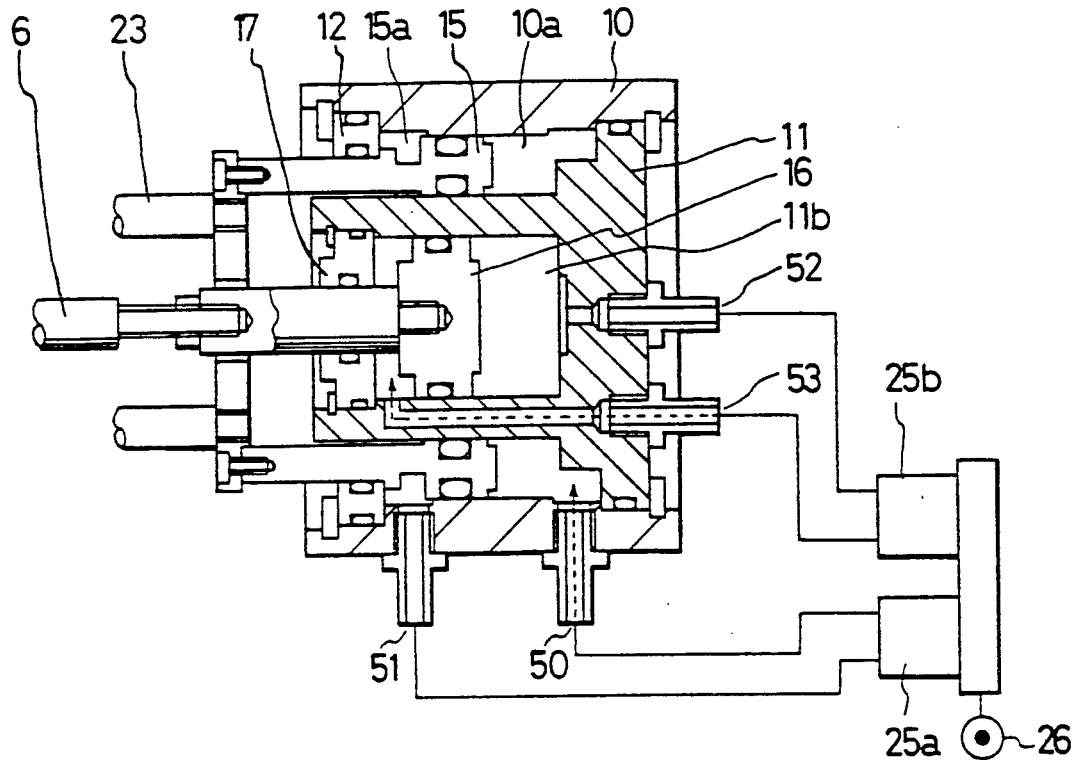
FIG. 2 is a cross-sectional view of a portion of the gun of FIG. 1 when its nozzle is moved forward.
Figure 4:
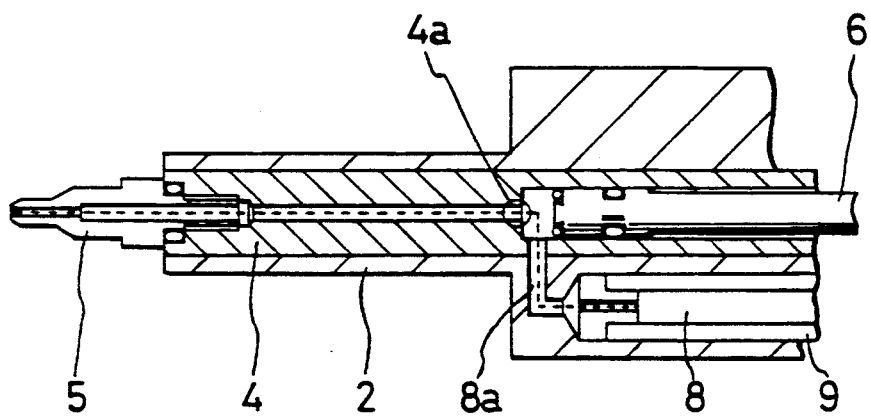
FIG. 4 is a cross-sectional view of the nozzle portion of the gun of FIG. 1 showing a compound gas introduction passage.

The action of this gas gun is described hereafter. With the gun in the state shown in FIG. 2, air is introduced into air inlet 50 from an air source 26 through an electrically controlled valve 25a so as to push out, or extend, nozzle piston 15. Concurrently, casing 23 and nozzle 5 together with central rod 4 move forward. Next, air is introduced into the air inlet 53 through a second electrically controlled valve 25b so as to push back the valve piston 16. Concurrently, valve rod 6 is moved back to open the passage between holes 8a and 4a, as shown in FIG. 4, so that gas from reservoir 9 can be delivered while nozzle 5 remains in the same position.

Figure 3:
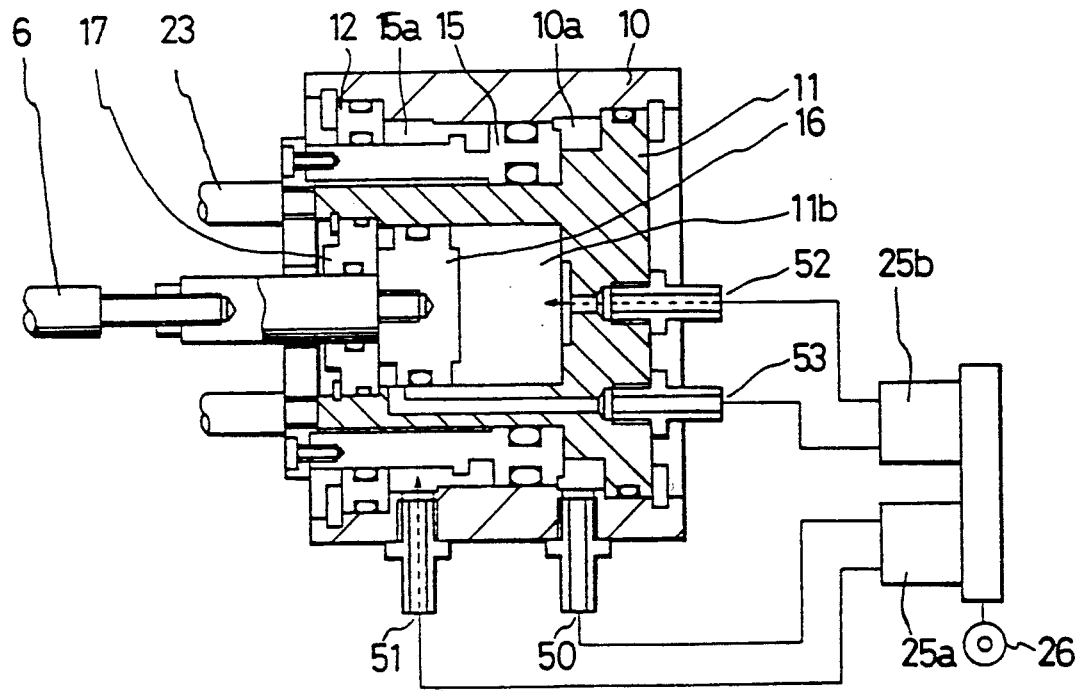
FIG. 3 is a cross-sectional view of a portion of the gun of FIG. 1 when the nozzle is moved backward.

As shown in FIG. 3, air is then introduced into the air inlet 52 through valve 25b, while supplying air inlet 50 with air, so as to push out valve piston 16. Concurrently, the valve rod 6 moves forward and thereby block the passage between holes 8a and 4a. Further, air is introduced into air inlet 51 through valve 25a so as to push back the nozzle piston 15. Concurrently, both the casing 23 and the nozzle 5 together with central rod 4 move backward. In this step, it is necessary to evacuate the air from gap 11b so that valve rod 6 will not prevent central rod 4 from moving backward. Successively, air is introduced alternately into air inlets 52 and 53 through valve 25b, while providing air inlet 51 with air, so as to move valve rod 6 back and forth, and thereby open and close the passage between passage 8a and bore 4a.

As described above, the present invention employs a coaxial double structured cylinder for driving the nozzle and the valve of the gas gun. Therefore, drift of an image and damage to a sample caused by moving the nozzle back and forth can be effectively prevented, and also miniaturization of the driving mechanism can be realized.

Figure 5:
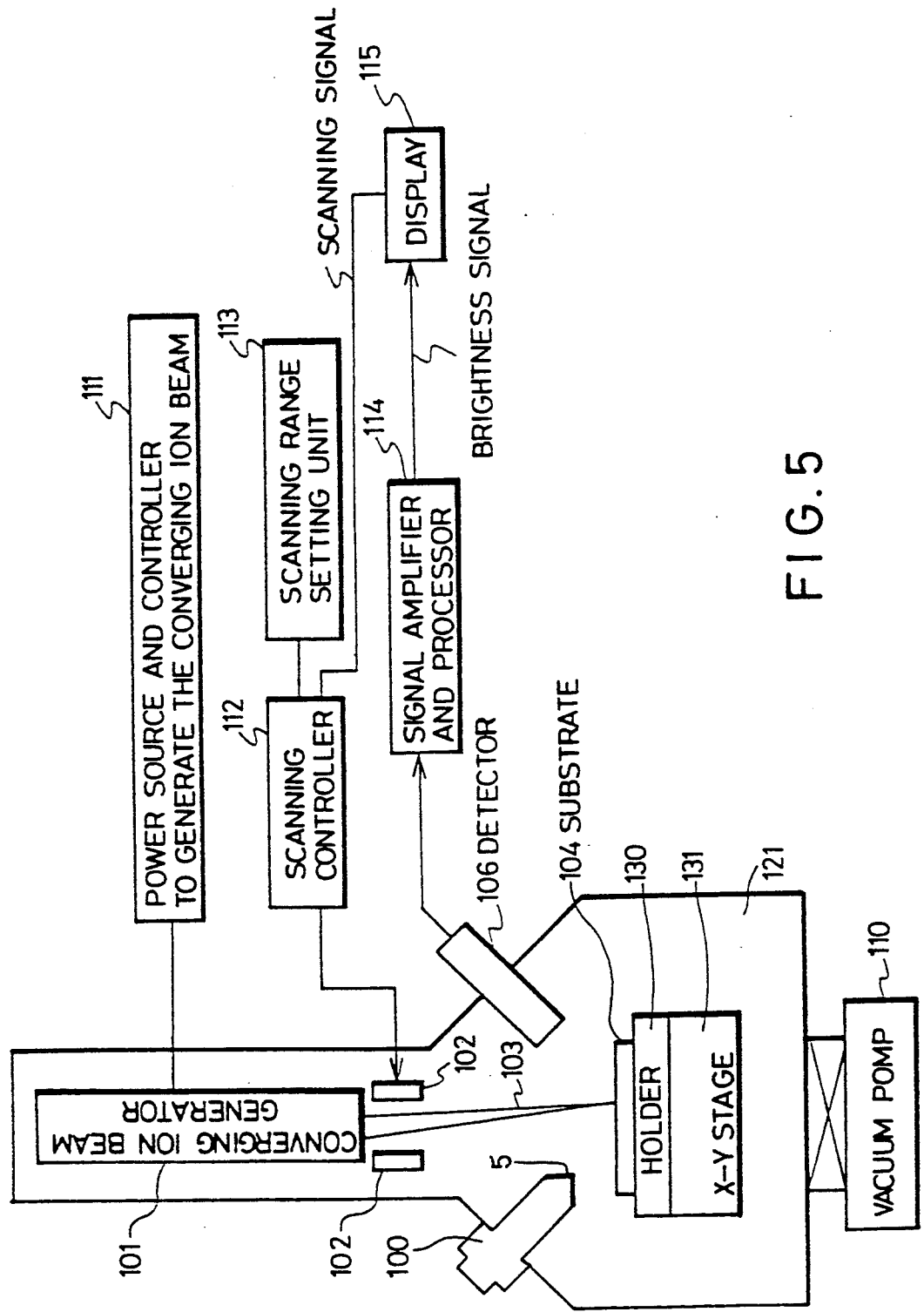
FIG. 5 is a cross-sectional view of an ion beam processing apparatus in accordance with the invention.

FIG. 5 shows a cross-section view of an ion beam processing apparatus using the above mentioned gas gun. A vacuum chamber 121 is connected to a vacuum pump 110 for maintaining a vacuum condition. A holder 130 is mounted on an X-Y stage 131 and holds a sample 104. A converging ion beam generator 101 generates a focussed ion beam and irradiates the surface of sample 104. The converging ion beam generator is controlled by a power source and controller 111.

The area irradiated with a focussed ion beam 103 is defined by scanning electrodes 102 which receive signals from a scanning controller 112 and scanning range setting unit 113. The focussed ion beam scans a certain area of the sample 104 under control of scanning controller 112 and scanning range setting unit 113. A gas gun 100 provided in vacuum chamber 121 directs an organic compound vapor toward the sample surface being irradiated by ion beam 103. A detector 106 detects secondary charged particles emitted from sample 104 by irradiation with ion beam 103. Detector 106 is connected with a signal amplifier and processor 114 and display 115 for displaying an image of the sample 104 surface.

A predetermined portion of the sample 104 surface is placed directly below the exit portion of converging ion beam generator 101 and the predetermined portion is irradiated with a scanning focussed ion beam for displaying a surface image or processing the surface of sample 104. When sample 104 is irradiated with a focussed ion beam, nozzle 5 of gas gun 100 is moved forward and a valve of gas gun 100 is controlled for the corresponding treatment, for example for observation or sputtering the valve is closed, and for forming a pattern film the valve is opened and an organic compound vapor and a focussed ion beam are directed to the surface of sample 104. When sample 104 is moved by X-Y stage 131, nozzle 5 is moved backward and the valve is closed.

This application relates to subject matter disclosed in Japanese application U2-32522, filed on Mar. 28, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A gas gun for an ion beam processing apparatus said gun comprising:

means defining a first cylinder;

a first piston disposed in said first cylinder for movement along a longitudinal axis;

means defining a second cylinder;

a second piston disposed in said second cylinder for movement parallel to the longitudinal axis;

a nozzle means including a nozzle and an intermediate rod carrying said nozzle and providing a flow path to said nozzle, said intermediate rod having a valve bore and being coupled to said first piston for movement therewith; and a valve rod seated in said valve bore, coupled to said second piston for movement therewith and movable parallel to the longitudinal axis between a closing position in which said flow path is blocked and an opening position in which said flow path is open.

2. A gas gun as defined in claim 1 wherein said second cylinder is enclosed by said first cylinder.

3. A gas gun as defined in claim 1 further comprising a casing supporting said intermediate rod and provided with a reservoir insertion opening.

4. A gas gun as defined in claim 1 wherein both of said pistons are gas-driven.

5. A gas gun as defined in claim 1 wherein said second cylinder is enclosed by said first cylinder.

6. A gas gun as defined in claim 1 further comprising a casing supporting said intermediate rod and provided with a reservoir insertion opening.

7. An ion beam processing apparatus comprising: a converging ion beam generator for generating a focussed ion beam; means including scanning electrodes for deflecting the ion beam across a sample surface; detector means for detecting charged particles emitted from the sample surface upon irradiation by the ion beam; and a gas gun as defined in claim 1 for directing a stream of gas onto the sample surface.

* * * * *